United States Patent
Lew et al.

(10) Patent No.: US 9,577,628 B2
(45) Date of Patent: Feb. 21, 2017

(54) GATE PULSING GATE LADDER

(71) Applicant: Lockheed Martin Corporation, Bethesda, MD (US)

(72) Inventors: Wilbur Lew, Mount Laurel, NJ (US); Roland Cadotte, Jr., Freehold, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 121 days.

(21) Appl. No.: 14/681,783

(22) Filed: Apr. 8, 2015

(65) Prior Publication Data

US 2016/0301405 A1    Oct. 13, 2016

(51) Int. Cl.
| H03K 17/687 | (2006.01) |
| H03K 17/14 | (2006.01) |
| H03F 3/04 | (2006.01) |
| H03F 3/30 | (2006.01) |

(52) U.S. Cl.
CPC ............. *H03K 17/145* (2013.01); *H03F 3/04* (2013.01); *H03F 3/302* (2013.01); *H03F 2200/18* (2013.01); *H03F 2200/451* (2013.01); *H03K 17/687* (2013.01); *H03K 2217/0054* (2013.01)

(58) Field of Classification Search
None
See application file for complete search history.

(56) References Cited

U.S. PATENT DOCUMENTS

| 5,757,237 A * | 5/1998 | Staudinger ............ H03F 1/0266 330/285 |
| 7,280,063 B2 | 10/2007 | Ozalevli et al. |
| 7,616,144 B2 | 11/2009 | Mulder et al. |
| 8,027,271 B2 * | 9/2011 | Haraguchi ........ H04L 29/12028 370/254 |
| 2007/0090902 A1 | 4/2007 | Deligianni et al. |
| 2008/0246537 A1 | 10/2008 | Aziz |
| 2011/0181360 A1 * | 7/2011 | Li ........................ H03F 1/223 330/277 |
| 2012/0299658 A1 * | 11/2012 | Ezzeddine ............ H03F 1/0205 330/296 |
| 2013/0082752 A1 | 4/2013 | Sawarkar |
| 2014/0184337 A1 | 7/2014 | Nobbe et al. |

OTHER PUBLICATIONS

International Search Report dated Jul. 26, 2016 for related International Application No. PCT/US16/126818.

* cited by examiner

*Primary Examiner* — Tuan T Lam
(74) *Attorney, Agent, or Firm* — Howard IP Law Group, P.C.

(57) ABSTRACT

A gate pulsing gate ladder circuit includes a series connected resistor ladder with bond pads connected to the resistor ladder between adjacent resistors. An electrical node is positioned between a first and second resistor of the resistor ladder. The electrical node is electrically connected to a gate electrode of a field effect transistor (FET). A power supply produces a constant power voltage that is applied to a pre-selected bond pad to produce a desired bias voltage at the gate electrode of the FET. A selectable gate enable voltage source is connected to an and of the resistor ladder at the first resistor and is configured to produce a first and second voltage level that when combined with the constant power voltage produces a voltage level that causes the FET to be in a conducting state or non-conducting state, respectively.

20 Claims, 2 Drawing Sheets

US 9,577,628 B2

GATE PULSING GATE LADDER

FIELD OF THE INVENTION

This application relates to electronic circuits. More particularly, the application relates to field effect transistors (FETs).

BACKGROUND OF THE INVENTION

Field effect transistors (FETs) are three terminal devices that are commonly used in radio frequency (RF) and microwave electronic circuitry to amplify signals. The three terminals of a FET include a gate, a source and a drain terminal. The gate is commonly used as the input of the FET and the drain is commonly used as the output of the FET. A voltage applied to the gate of the FET creates an electric field that controls the resistance between the FET's drain and source terminals. For a constant supply voltage the resulting resistance between the source and drain determines an electrical current. A small voltage applied to the gate of the FET is capable of causing a large change in output voltage by controlling the current flowing from drain to source. This is the basic operation of amplification.

During operation, biasing a FET is performed by applying a selected voltage to the gate terminal. The bias voltage defines a resistance between the source and drain that results in a DC or quiescent current that flows between the drain and the source. A time varying voltage signal applied to the gate causes current between the drain and source current to vary about its quiescent value.

In practice, the DC gate voltage required to achieve a desired quiescent drain current varies from FET to FET due to fabrication tolerances. As a result of these variations that occur during fabrication, each FET is tested to identify the required bias voltage needed to achieve a desired or target quiescent current for that particular FET. Once the required gate bias voltage is identified, additional circuitry may be implemented as a gate ladder to produce a predetermined voltage. For example, a voltage of negative 2.5 volts (−2.5V) may be applied to the gate terminal of the FET to set the desired FET's quiescent current.

Radar applications utilize FETs to amplify signals. Radar applications require that FETs be pulsed between an "ON" state, where current is allowed to flow between the drain and the source, and an "OFF" state, where no appreciable current flows between the drain and source terminals. Conventionally, FETs formed from semiconductors such as gallium arsenide (GaAs) are pulsed by placing a switch between the drain and the power supply and operating the switch to control the flow of drain-source current in a process called drain pulsing. The switches required for drain pulsing must be capable of switching on and off large drain currents with low losses. Accordingly, these switches are typically large, expensive, slow and add complexity, thereby making drain pulsing less than optimal for high-frequency applications like radar.

Gate pulsing refers to the pulsing operation of a FET by varying the bias voltage supplied to the gate terminal to control the drain to source current. Gate pulsing is not suitable for GaAs and similar semiconductor devices because of their low gate to drain breakdown voltages. Newer semiconductor technologies, such as gallium nitride (GaN) and silicon carbide (SiC) have higher gate to drain breakdown voltages and therefore, may be used for gate pulsing. However, this typically requires an additional power source for providing a pulsing bias voltage to the gate terminal, thereby adding complexity and cost.

Alternative solutions for pulsing FETs which address the above challenges are desired.

SUMMARY

There is disclosed a gate pulsing gate ladder circuit for pulsing a FET having a gate electrode, a drain electrode and a source electrode. An electrical node is electrically connected to the gate electrode which is in turn connected to a resistor ladder comprising a plurality of resistors connected in series with one another. The electrical node is connected between a first and second resistor of the resistor ladder. A plurality of bond pads are provided wherein each bond pad is electrically connected to said resistor ladder at a point between adjacent resistors of the resistor ladder. A power supply is configured to supply a constant voltage and is connected to a selected one of the bond pads. A selectable pulse enable voltage source, of similar value to the constant supply, is connected to the first resistor so that the first resistor is connected between the pulse enable voltage source and the electrical node connected to the gate electrode of the FET. The selectable pulse enable voltage source is configured to produce a first voltage level that places the FET in a conducting state, when disabled, and a second voltage level that causes said FET to be in a non-conducting state, when enabled.

DETAILED DESCRIPTION

FETs are semiconductor devices having three terminals for providing amplification. A small control voltage applied to the gate terminal of the FET is capable of controlling a large current flow between the source terminal and the drain terminal. During operation, a selected bias voltage is applied to the gate terminal which produces a desired quiescent current between the source and drain. Due to variations occurring during fabrication of FETs, the bias voltage needed to produce the desired quiescent current may vary across individual FETs. To address the variability in bias voltage, a gate ladder may be used to produce a selectable bias voltage that may be applied to the gate terminal of the FET.

Figure 1:
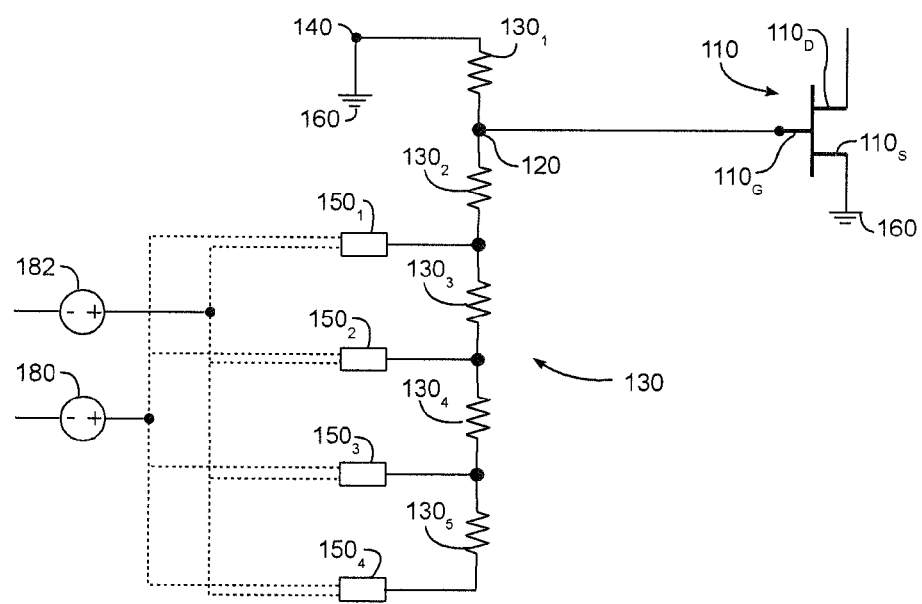
FIG. 1 is a general schematic view of a conventional gate pulsing gate ladder circuit.

Referring to FIG. 1, there is shown a general schematic diagram of a conventional gate pulsing gate ladder 100. Field effect transistor (FET) 110 includes a gate electrode $110_G$, a drain electrode $110_D$ and a source electrode $110_S$. A small control voltage at the gate electrode $110_G$ is capable of controlling the flow of a large current between the drain electrode $110_D$ and the source electrode $110_S$. The gate electrode $110_G$ is coupled to a resistor ladder 130 at electrical node 120. Resistor ladder 130 includes a plurality of resistors $130_1$-$130_5$. Electrical node 120 is connected to the gate electrode $110_G$ and positioned on the resistor ladder 130 between resistor $130_1$ and resistor $130_2$. Resistor $130_1$ is coupled to a reference potential or ground 160 via node 140. A plurality of bond pads $150_1$-$150_4$ are connected to resistor ladder 130 between adjacent resistors $130_1$-$130_5$. For example, bond pad $150_1$ is connected to resistor ladder 130 between resistor $130_2$ and resistor $130_3$. Bond pad $150_2$ is connected to resistor ladder 130 between resistor $130_3$ and resistor $130_4$. Bond pad $150_3$ is connected to resistor ladder 130 between resistor $130_3$ and resistor $130_4$ and bond pad $150_4$ is connected to resistor ladder 130 between resistor $130_4$ and resistor $130_5$.

To provide proper bias to operate FET 110, a bias voltage is applied to the gate electrode $110_G$ of the FET 110 via electrical node 120. At a proper bias voltage level FET 110 is maintained in an "ON" or conducting state in which current flows between the drain electrode $110_D$ and the source electrode $110_S$. Due to variations in fabrication, variations exist between the proper bias voltage level of individual FETs 110. As a result, the proper bias voltage needed to maintain a particular FET 110 at a desired quiescent current might differ from FET to FET. Resistor ladder 130 and bond pads $150_1$-$150_4$ allow for compensation of these differences in the required bias voltage levels. When a FET 110 is fabricated, it is tested to determine its proper bias voltage, which needs to be applied to the gate electrode $110_G$ to produce the desired quiescent current. Depending on the amount of bias voltage needed/desired, power supply 180 is selectively connected to one of bond pads $150_1$-$150_4$. Power supply 180 applies a voltage potential to the selected bond pad $150_1$-$150_4$. For example, power supply 180 may provide a voltage of about −5 v to one of bond pads $150_1$-$150_4$. The application of the power supply voltage to one of bond pads $150_1$-$150_4$ causes a current to flow between the selected bond pad and ground 160 along a portion of resistor ladder 130. The current flows through the portion of the resistor ladder 130 which comprises one or more of resistors $130_1$-$130_5$.

The bond pad $150_1$-$150_4$ that is selected to be connected to power supply 180 determines how many of resistors $130_1$-$130_5$ are in the bias current path. As the bias current flows through one or more of the resistors, a voltage drop occurs at each resistor producing a particular bias voltage at electrical node 120. The bias voltage level is dependent on the number of resistors in resistor ladder 130 between ground 160 and the selected bond pad $150_1$-$150_4$. In this manner, the bias voltage for the particular FET 110 may be selected by connecting the power supply 180 to the bond pad $150_1$-$150_4$ to produce the desired bias voltage level at electrical node 120. Different bond pads $150_1$-$150_4$ may be selected for different FETs, depending on the determined bias voltage needed for the particular FET being used.

Referring again to FIG. 1, FET 110 may be pulsed by applying a voltage to bond pad $150_1$-$150_4$ sufficient to oscillate FET 110 between an OFF and ON state. For example, when −2.5 v to −5 v is applied to bond pad $150_1$-$150_4$, FET 110 is biased to an ON position and current flows between the drain electrode $110_D$ and source electrode $110_S$. However in the event that the voltage at bond pad $150_1$-$150_4$ were increased to a level of −10 v, FET 110 would be biased to an OFF position and no appreciable current will flow between the drain electrode $110_D$ and the source electrode $110_S$. However, most semiconductor power supplies are incapable of producing two different voltage levels. For this reason an additional power supply is required. In the gate pulsing gate ladder 100 of FIG. 1, a second power supply 182 is provided and connected to contact bonding pads $150_1$-$150_4$. The second power supply 182 is connected to the gate resistor ladder 130 in a similar manner as the first power supply. To gate pulse FET 110, power supply 180 may be configured to supply a constant −5 v to the selected bond pad $150_1$-$150_4$. To generate a pulse, second power supply 182 is selectively energized to provide −10 v to produce a bias voltage at the gate electrode $110_G$ of −5 v which biases the FET 110 to the OFF state. By periodically switching between power supply 180 and power supply 182, the FET 110 is alternately biased between a conducting and non-conducting state.

Figure 2:
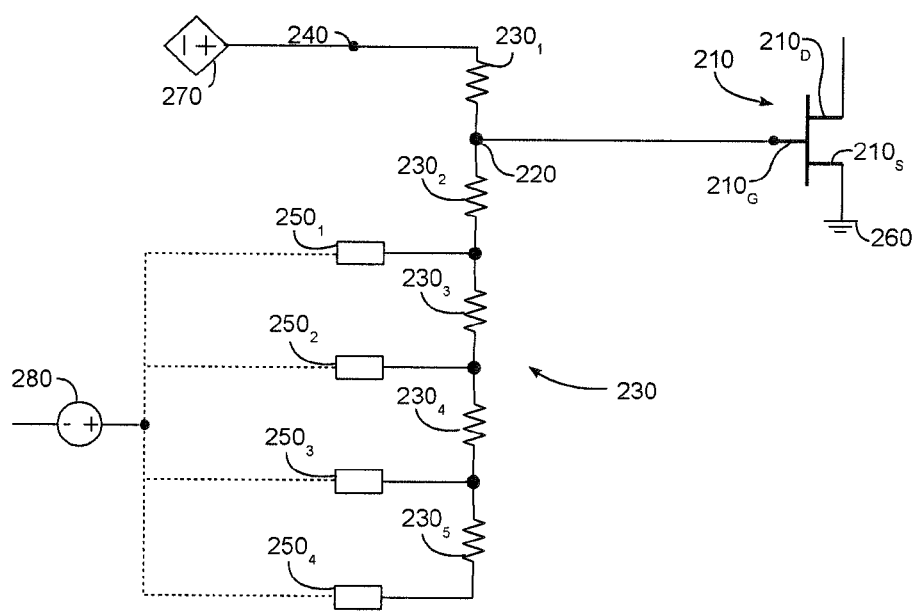
FIG. 2 is a general schematic view of a gate pulsing gate ladder according to an embodiment of the disclosure.

FIG. 2 shows a gate pulsing gate ladder circuit according to an embodiment of the present disclosure. The embodiment illustrated in FIG. 2 allows electronic circuitry, specifically a field effect transistor (FET) 210 to be gate pulsed from a gate ladder without the need for an additional voltage source (180, 182 of FIG. 1). For certain applications (e.g. radar applications) pulsing the FET 210 between its on and off states is required. A typical radar implementation may require a FET to be pulsed at a frequency of about 50 megahertz (MHz). Conventionally, FETs have been fabricated from GaAs and have been drain pulsed. Drain pulsing requires switches that can switch on and off large drain currents which are often measured in amperes (amps) with low loss, as opposed to gate currents, which may be measured in microamps. Therefore, these switches are typically large, expensive and slow, thereby making drain pulsing difficult to implement.

FETs may also be pulsed by controlling the bias voltage applied to the gate electrode. However, gate pulsing is not suitable for some FETs, such as FETs comprising GaAs and certain other semiconductor devices. This is due to these devices' low gate to drain breakdown voltages. Large swings in bias voltage will exceed the gate to drain breakdown voltage and push the FET into saturation. Other FETs, such as FETs fabricated from gallium nitride (GaN) have significantly greater gate to drain breakdown voltages. As a result, these semiconductors are better suited for gate pulsing. Gate pulsing has a number of significant advantages over drain pulsing, including direct control of the FET from a silicon (Si) control chip, faster switching times, and no degradation in power added efficiency (PAE).

The gate pulsing gate ladder 200 of FIG. 2 includes FET 210, which comprises a gate electrode $210_G$, a drain electrode $210_D$ and a source electrode $210_S$. FET 210 may be of almost any size, as very little current flows into the gate $210_G$ (generally less than one milliamp). In one embodiment, the device may be implemented as a 8×50 µm GaN 0.15 µm FET, where the FET includes 8 fingers and a gate width of 50 µm. While FET 210 may be a GaN FET, the gate pulsing gate ladder described herein may be used with any wide bandgap semiconductor FET where the device is typically not operated near its gate to drain breakdown voltage limit. For example, devices of this type may be fabricated from GaN or SiC, as well as other semiconductors having a relatively high gate to drain breakdown voltage. A small control voltage at the gate electrode $210_G$ is sufficient to control a large current flow between the drain electrode $210_D$ and the source electrode $210_S$. The gate electrode $210_G$ is coupled to a resistor ladder 230 at electrical node 220. Resistor ladder 230 includes a plurality of resistors $230_1$-$230_5$. Resistors $230_1$-$230_5$ may have varying resistance values. By way of non-limiting example, resistor $230_1$ may have a resistance value of about 1500 ohms; resistor $230_2$ may have a resistance value of about 1000 ohms; resistor $230_3$ may have a resistance value of about 200 ohms; resistor $230_4$ may have a resistance value of about 150 ohms and resistor $120_5$ may have a resistance value of about 170 ohms. Assuming a constant power supply voltage 280 of −5 volts, bond pads $250_1$-$250_4$ provide connections to voltage levels between about −2.0 volts and −2.5 volts. Electrical node 220 is connected to the gate electrode $210_G$ and positioned on the resistor ladder 230 between resistor $230_1$ and resistor $230_2$.

Resistor $230_1$ is coupled to a gate enable voltage source 270, which provides a time variant voltage level at node 220 via resistor $230_1$. A plurality of bond pads $250_1$-$250_4$ are connected to resistor ladder 230 between adjacent resistors $230_1$-$230_5$. For example, bond pad $250_1$ is connected to resistor ladder 230 between resistor $230_2$ and resistor $230_3$. Bond pad $250_2$ is connected to resistor ladder 230 between resistor $230_3$ and resistor $230_4$. Bond pad $250_3$ is connected to resistor ladder 230 between resistor $230_3$ and resistor $230_4$ and bond pad $250_4$ is connected to resistor ladder 230 between resistor $230_4$ and resistor $230_5$.

To provide proper bias to FET 210, a bias voltage is applied to the gate electrode $210_G$ of the FET 210 via electrical node 220. At a proper bias voltage, the FET 210 is maintained in an "ON" or conducting state in which current flows between the drain electrode $210_D$ and the source electrode $210_S$. During normal operation, the FET 210 is on, and a quiescent current flows through FET 210. By way of non-limiting example, a bias voltage of about −2.5 v may be sufficient to produce a typical quiescent current through FET 210. Bias voltage typically ranges between −1.25V thru −2.5V. During fabrication, variations arise in individual FETs which create differences in the required gate voltage needed for specific FETs 210. As a result, the proper bias voltage needed to maintain the FET 210 at a desired quiescent current might differ from one FET to another. Resistor ladder 230 and bond pads $250_1$-$250_4$ allow for compensation of these differences. When a FET 210 is fabricated, it is tested to determine the proper bias voltage that is required at the gate electrode $210_G$ to produce the desired quiescent current. Depending on the amount of bias voltage needed/desired, power supply 180 is selectively connected to one of bond pads $250_1$-$250_4$. Power supply 280 provides a voltage to one of bond pads $250_1$-$250_4$. For example, power supply 280 may provide a voltage of about −5 v to one of bond pads $250_1$-$250_4$. The application of a voltage to one of bond pads $250_1$-$250_4$ causes a current to flow between the selected bond pad and the pulse enable power source 270. According to one embodiment, pulse enable power source may be a control chip which is powered independently of the power supply 280. For example, a silicon germanium (SiGe) control chip may be used. The control chip may be powered by power source 270, and include control circuitry which produces a pulsed output signal that oscillates between 0 volts and −5 volts. The current flows through the resistor ladder 230 through one or more of resistors $230_1$-$230_5$.

The bonding pad $250_1$-$250_4$ selected for connection to power supply 280 determines how many of resistors $230_1$-$230_5$ the bias current will flow through. For each bond pad, the bond pad $250_{1-4}$ is electrically connected to the resistor ladder 230 at a point having at least one of resistors $230_{1-2}$ between the bond pad $250_{1-4}$ and the electrical node 220 between resistor $230_1$ and resistor $230_2$. As the bias current flows through one or more of the resistors, a voltage drop occurs at each resistor which produces a particular bias voltage at electrical node 220 based on the number of resistors in resistor ladder 230 between pulse enable voltage 270 and the selected bond pad $250_1$-$250_4$. In this way, the bias voltage for the particular FET 210 may be selected by connecting the power supply 180 to the bond pad $250_1$-$250_4$ that produces the desired bias voltage level at electrical node 120. Different bond pads $250_1$-$250_4$ may be selected for different FETs, depending on the determined bias voltage needed for the particular FET being used.

FET 210 may be pulsed by applying a voltage to the gate electrode $210_G$ sufficient to oscillate FET 210 between an OFF and ON state. For example, when about −2.5 v is applied to the gate electrode $210_G$ of FET 210, FET 210 is biased to an ON position and current flows between the drain electrode $210_D$ and the source electrode $210_S$. However, if the voltage at the gate electrode $210_G$ were increased to a level of about −5 v, FET 210 would be biased to the OFF position and no appreciable current will flow between the drain electrode $210_D$ and the source electrode $210_S$. Pulse enable voltage source 270 eliminates the need for a second power supply at bond pads $150_1$-$150_4$. Pulse enable voltage source 270 may comprise a low power control circuit which may provide an output voltage which is time variant between 0 v and −5 v. To pulse FET 210 at its gate $210_G$, power supply 180 may be configured to supply a constant −5 v to the selected bond pad $250_1$-$250_4$. In order provide the gate pulsing of FET 210, a differential voltage level is produced at electrical node 220. The differential voltage is defined as the voltage between the −5 v applied by power supply 280 to the selected bond pad and the output voltage of pulse enable voltage source 270 which is connected to electrical node 220 via resistor $230_1$. When the output voltage of pulse enable voltage source 270 and the time invariant power voltage from power supply 280 combine, they produce a voltage level at node 220 that provides the biasing of the FET 110 to place the FET in an OFF or non-conducting state. By periodically supplying an additional voltage, the FET is alternately biased between a conducting and non-conducting state.

According to an embodiment of the gate pulsing gate ladder circuit 200 of FIG. 2, pulse enable voltage 270 is provided by a low power semiconductor control device. By way of non-limiting example, a control circuit configured to output a selectable output voltage and apply the output voltage to electrical node 220 may be fabricated from a silicon-based control circuit. In one embodiment the control circuit is fabricated from a silicon germanium (SiGe) based semiconductor circuit. The pulse enable voltage source may be configured to provide an output voltage that is selectable between a range of zero and −5 volts. The pulse enable voltage source 270 may include control circuitry which is configured to provide a time variant output voltage between about 0 v and about −5 v. The output voltage of the pulse enable voltage source 270 may be configured to oscillate between about 0 v and about −5 v at a frequency of about 50 MHz to about 1 GHz. Additionally gate switching decrease radar dead time, which is the time between transmit and receive, enabling engagement of targets in close quarters.

Thus, embodiments of the present invention improve upon conventional gate ladder circuitry by allowing the voltage at a given node (node 1 of FIG. 2) to be time variant and therefore capable of swinging between the voltage required to place the FET in its quiescent state and the voltage required to put the FET in a zero current mode or OFF state. In this embodiment the voltage at the second node varies between the voltage required to put the FET in its quiescent mode and its zero current or OFF state.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A gate pulsing gate ladder circuit for pulsing a field effect transistor (FET) having a gate electrode, a drain electrode and a source electrode, the circuit comprising:
    an electrical node electrically connected to said gate electrode;
    a resistor ladder comprising a plurality of resistors connected in series with one another, wherein the electrical node is connected between a first resistor of said resistor ladder at a first end of the resistor ladder and a second resistor of the resistor ladder, the second resistor being immediately adjacent to the first resistor;
    a plurality of bond pads, each bond pad being electrically connected to the resistor ladder at a corresponding node between two immediately adjacent resistors in the plurality of resistors, wherein each bond pad is disposed such that at least one of said plurality of resistors is between the bond pad and the electrical node;
    a power supply configured to supply a constant voltage to a selected one of the plurality of bond pads;
    a selectable pulse enable voltage source connected to the first resistor such that the first resistor is between the pulse enable voltage source and the electrical node connected to the gate electrode of the FET;
    wherein the selectable pulse enable voltage source is configured to produce a first voltage level that places the FET in a conducting state and a second voltage level that causes the FET to be in a non-conducting state.

2. A gate pulsing bias circuit comprising:
    a resistor ladder comprising a plurality of resistors electrically connected in series;
    a gate enable voltage source electrically connected to a first resistor of the plurality of resistors at a first end of the resistor ladder;
    a first electrical node between the first resistor and a second resistor of the plurality of resistors, the second resistor directly adjacent to the first resistor;
    a field effect transistor (FET), a gate electrode of the FET being electrically connected to the first electrical node;
    a plurality of bond pads, each bond pad of the plurality of bond pads being electrically connected to a corresponding electrical node located between two adjacent resistors of the resistor ladder, wherein there is at least one resistor of the plurality of resistors electrically connected in series between any one of the bond pads and the first electrical node;
    a power supply configured to supply a constant voltage level to a selected one of the plurality of bond pads;
    wherein the gate enable voltage source is configured to produce a first voltage level that places the FET in a conducting state and a second voltage level that places the FET in a non-conducting state.

3. The gate pulsing bias circuit of claim 2, wherein the gate enable voltage source is configured to generate a time varying output voltage between about zero volts and about −5 volts.

4. The gate pulsing bias circuit of claim 3, wherein the gate enable voltage source is configured to oscillate the output voltage between about zero volts and −5 volts at a frequency of about 50 MHz to about 1 GHz.

5. The gate pulsing bias circuit of claim 2, wherein the resistor ladder comprises five resistors connected in series.

6. The gate pulsing bias circuit of claim 5, wherein each successive resistor of the resistor ladder has a lower resistance value than the resistor that immediately precedes it.

7. The gate pulsing bias circuit of claim 2, wherein the gate enable voltage source comprises a low power control chip, the low power control chip comprising a silicon-based semiconductor chip.

8. The gate pulsing bias circuit of claim 7, wherein the silicon-based semiconductor chip comprises silicon germanium (SiGe).

9. The gate pulsing bias circuit of claim 2, wherein the constant voltage power supply outputs a constant voltage level of −5 in order to produce a bias voltage level at the first electrical node of about −2 volts to about −2.5 volts.

10. The gate pulsing bias circuit of claim 2, wherein the FET comprises a wide bandgap semiconductor.

11. The gate pulsing bias circuit of claim 10, wherein the FET comprises Gallium Nitride (GaN).

12. The gate pulsing bias circuit of claim 2, wherein the FET comprises Silicon Carbide (SiC).

13. A method of gate pulsing a field effect transistor (FET) comprising the steps of:
    connecting a gate electrode of said FET to an electrical node between a first resistor and a second resistor of a resistor ladder, the resistor ladder comprising a plurality of resistors electrically connected in series;
    connecting a plurality of bond pads to said resistor ladder at positions, such that at least one resistor of the plurality of resistors is located between each bond pad of the plurality of bond pads;
    connecting a constant voltage supply to a selected bond pad of the plurality of bond pads; and
    connecting a gate enable voltage source to the first resistor of said resistor ladder, opposite said electrical node.

14. The method of claim 13, further comprising:
    generating a time variant voltage level from the gate enable voltage source; and
    applying the time variant voltage level to the electrical node via the first resistor.

15. The method of claim 14, further comprising:
    varying the time variant voltage level between about 0 volts and about −5 volts.

16. The method of claim 14, further comprising:
    varying the time variant voltage level between a first voltage level and a second voltage level at a frequency of about 50 MHz to about 1 GHz.

17. The method of claim 13, wherein the FET comprises a wide bandgap semiconductor.

18. The method of claim 17, wherein the FET comprises Gallium Nitride (GaN).

19. The method of claim 17, wherein the FET comprises Silicon Carbide (SiC).

20. The method of claim 14, further comprising:
controlling the gate enable voltage source with a low power silicon based control chip that is independent of the constant voltage supply.

* * * * *